(12) United States Patent  (10) Patent No.: US 7,642,809 B2
Malekkhosravi et al.  (45) Date of Patent: Jan. 5, 2010

(54) DIE APPARATUS HAVING CONFIGURABLE INPUT/OUTPUT AND CONTROL METHOD THEREOF

(75) Inventors: Behnam Malekkhosravi, La Jolla, CA (US); Daniel J. Woodard, San Diego, CA (US); David Ian West, San Diego, CA (US)

(73) Assignee: Rapid Bridge LLC, San Diego, CA (US)

( * ) Notice: Subject to any disclaimer, the term of this patent is extended or adjusted under 35 U.S.C. 154(b) by 0 days.

(21) Appl. No.: 11/672,013

(22) Filed: Feb. 6, 2007

(65) Prior Publication Data

US 2008/0186053 A1   Aug. 7, 2008

(51) Int. Cl.
*H03K 19/0175* (2006.01)
*H03K 19/00* (2006.01)

(52) U.S. Cl. .............. 326/41; 326/47; 326/101; 716/17

(58) Field of Classification Search ............. 326/38, 326/39, 40, 41, 47, 101; 716/17
See application file for complete search history.

(56) References Cited

U.S. PATENT DOCUMENTS

| 5,825,202 | A | * | 10/1998 | Tavana et al. | 326/39 |
| 6,218,858 | B1 | * | 4/2001 | Menon et al. | 326/39 |
| 6,480,026 | B2 | * | 11/2002 | Andrews et al. | 326/39 |
| 6,674,166 | B2 | | 1/2004 | Rao et al. | |
| 6,962,868 | B2 | | 11/2005 | Sakamoto et al. | |
| 7,023,238 | B1 | * | 4/2006 | Camarota | 326/38 |
| 2003/0146774 | A1 | | 8/2003 | Coughlin et al. | |
| 2006/0253825 | A1 | | 11/2006 | McGrath et al. | |

* cited by examiner

*Primary Examiner*—Daniel D Chang
(74) *Attorney, Agent, or Firm*—Klein, O'Neill & Singh, LLP (57) ABSTRACT

A metal configurable I/O structure for an integrated circuit is disclosed. The metal configurable I/O structure may be configured for one of any of a plurality of I/O specifications. Preferably a common voltage reference and a common current reference is generated for provision to a plurality of I/O structures.

11 Claims, 9 Drawing Sheets

DIE APPARATUS HAVING CONFIGURABLE INPUT/OUTPUT AND CONTROL METHOD THEREOF

BACKGROUND

The invention relates generally to integrated circuits, and more particularly to integrated circuit input/output designs.

Multi-chip and even board level processing has and continues to be increasingly implemented as integrated circuitry on a single chip, with the single chip sometimes referred to as a system-on-chip (SOC). SOCs may send to and receive signals from a variety of devices, such as a variety of memory devices, lower level devices, or devices performing very specialized functions. Each type of device, as well as sub-types of each type of device, may require or use interface signals and pathways which must conform to somewhat specific requirements, and these requirements may differ from one another.

The requirements, which often relate to current strength, voltage levels, input and output impedances, and other matters, are generally promulgated by various standards bodies, although some "standards" may be simply de-facto standards or device manufacturer specific. In any event, SOC integrated circuits may be required to provide input/output (I/O) according to requirements of multiple I/O standards, either simultaneously or across different versions of a chip.

The provision of I/O in accordance with multiple standards poses difficulties in chip design. I/O related circuitry is often placed in I/O slots, generally in an I/O ring about a periphery of a device. The use of different I/O slots configured to meet a variety of I/O standards may increase design time. The replacement of I/O slots of one type with I/O slots of another type, for example for a different version of a chip, may necessitate rework outside of the I/O slot, as well as reverification of significant portions of the design. Moreover, the use of a variety of I/O slots may require tradeoffs in area and power usage, and may degrade overall chip performance Further complicating matters, I/O sections are often designed at different times, obtained from IP vendors, or integrated into multiple chips. In general, therefore each I/O slot is self-contained. Accordingly, each I/O pad may require its own power structure, electrostatic discharge (ESD) structure, reference current and voltage and calibration. Unfortunately, complex interfaces, design inefficiency and performance degradation may result. For example, each I/O slot may require unique power structures, unique busses, and, possibly, unique power pads. In addition, often additional silicon area is required for developing different voltage references, increasing area and power usage, or the number of voltage references may be reduced, degrading chip performance.

Moreover, calibration circuitry to provide appropriate I/O operation over process, voltage, and temperature variations (PVT) may be required to be duplicated for each different type of I/O slot, increasing design complexity and area and power requirements. Alternatively, calibration circuitry may be reduced or eliminated, and, for example, output circuit drivers may be enhanced so as to always provide a specified minimum current. Such a solution, unfortunately, results in excess current being provided during normal operation, resulting in increased power usage.

SUMMARY OF THE INVENTION

The present invention provides a die with an I/O ring. In one aspect the invention provides a configurable input/output (I/O) block comprising a plurality of subcells; and a metal layer configured to couple selected ones of the subcells in a configuration to provide I/O interfacing pursuant to a selected I/O requirement.

In another aspect the invention provides a method of configuring input/output (I/O) blocks, the method comprising providing one or more I/O blocks, each of the one or more I/O blocks having a plurality of subcells; determining one or more requirements for each of the one or more I/O blocks; and metallizing each of the I/O blocks to couple selected one of the subcells in a configuration indicative of the one or more requirements.

In another aspect the invention provides a die having integrated circuitry, the die comprising one or more configurable input/output (I/O) blocks, each of the I/O blocks comprising: a plurality of subcells; and a metal layer configured to couple selected ones of the subcells in a configuration to provide I/O interfacing indicative of an I/O requirement.

In another aspect the invention provides a die having integrated circuitry, the die comprising a plurality of input/output (I/O) blocks, each of the plurality of the I/O blocks having circuitry configured to provide one or more I/O interface signals according to one or more I/O requirements; and a calibration block configured to output to the plurality of the I/O blocks a signal adapted to calibrate the circuitry of the I/O blocks to adjust the one or more I/O interface signals.

In another aspect the invention provides a die having integrated circuitry, the die comprising a plurality of input/output (I/O) blocks, each of the plurality of the I/O blocks having circuitry configured to provide an I/O signal indicative of one or more I/O requirements; and a reference block configured to output to the I/O blocks an I/O information signal adapted to adjust the I/O signal.

In another aspect the invention provides a method of controlling configurable input/output (I/O) block on a die, the method comprising providing a plurality of I/O blocks, each of the I/O blocks having a circuit configured to provide I/O interfacing according to a requirement; receiving an I/O information signal at each of the plurality of the I/O blocks; and adjusting a signal generated for I/O interfacing to have characteristics indicative of information of the I/O information signal.

In another aspect the invention provides a die having integrated circuitry, the die comprising a plurality of input/output (I/O) blocks, each of the plurality of the I/O blocks configured to provide I/O interfacing according to one or more I/O requirements; and a reference voltage block configured to output a voltage reference signal to each of the I/O blocks, the voltage reference signal being configured to provide a reference voltage level to each of the I/O blocks.

In another aspect the invention provides a die having integrated circuitry, the die comprising a plurality of input/output (I/O) blocks, each of the plurality of the I/O blocks having circuitry to provide one or more I/O signals according to one or more I/O requirements a reference voltage block configured to output a signal indicative of a voltage level to each of the I/O blocks; and a calibration block configured to output to the plurality of the I/O blocks a signal configured to calibrate the one or more I/O signals.

In another aspect the invention provides a plurality of dies each having integrated circuitry, the integrated circuitry including an input/output (I/O) ring forming a plurality of I/O slots, each of the dies having a common base template of circuit elements in the I/O ring, at least some of the circuit elements arranged in subcells, with metallization connecting only some of the subcells based on a selected I/O standard for each I/O slot.

These and other aspects of the invention are more fully comprehended upon study of this disclosure.

BRIEF DESCRIPTION OF THE DRAWINGS

FIGS. 7A-N illustrate example circuits of use in subcells of an I/O slot according to an embodiment of the invention.

DETAILED DESCRIPTION OF THE INVENTION

Figure 1:
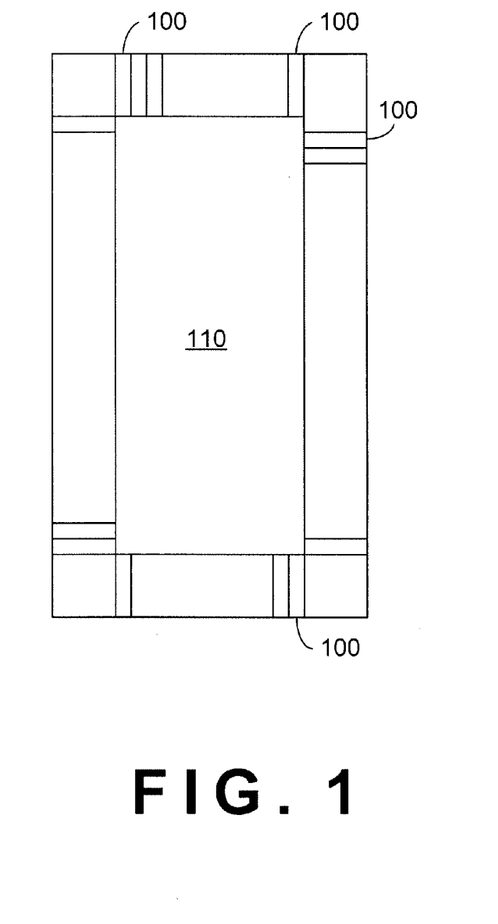
FIG. 1 is a block diagram of a die configurable to provide I/O according to one or more different requirements according to an embodiment of the invention.

FIG. 1 is a block diagram of a die 110 including a plurality of input/output (I/O) slots 100. In most embodiments, the die is a system-on-chip (SOC). The die includes layers of semiconductor material interspersed by metal layers, with the semiconductor material appropriately processed and the metal layer patterned so as to form integrated circuitry. As illustrated, a center area of the die provides logic and other functions for performance of tasks by the SOC with the I/O slots located about the periphery of the die. For clarity only a few I/O slots are shown in FIG. 1, often the entire periphery (excepting corners) contains I/O slots, with the periphery forming an I/O ring for the die.

The I/O slots are each wired to separate I/O pads (not shown), which provide a pathway to receive signals from and send signals to external devices. Each I/O slot generally should transmit and/or receive signals in accordance with one or more different requirements. Generally, the one or more requirements relate to current related requirements, voltage related requirements or impedance related requirements. The requirements may be, and often are, different depending on the interface standard to which a particular I/O slot should conform. In many embodiments a flexible supply domain is provided, with for example various power signals available to each of the slots, either via power connections to a supply bus or by metallization patterns connecting specific power signals.

Each I/O slot is formed of a base template of transistors, and in some embodiments additional resistive elements, and possibly capacitive or inductive elements. In most embodiments the base template includes sufficient components to allow for construction of an I/O slot in compliance with any one of multiple I/O standards. Thus, in most embodiments any I/O slot may be configured for use according to any one of multiple I/O standards, independent of configuration of the other I/O slots. Interconnection of components within the base template to form I/O slots is achieved through use of different metallization patterns. Thus, wafer semiconductor processing may be the same for chips configured for different I/O, with differences in metallization processing providing for different I/O configurations. The I/O slots may therefore be considered metal configurable I/O slots.

Preferably all, or substantially all, of the transistors of the base template have the same width/length ratios, subject to process variations. In some embodiments, transistors of the base template all, or substantially all, have width/length ratios so as to fall within the same modeling parameters. In some embodiments, however, the base template includes a number of transistors with varying width/length ratios and multiple resistor types and sizes. The use of a base template of commonly sized transistors generally provides for increased yield, as well as often providing for increased modeling accuracy.

Figure 2:
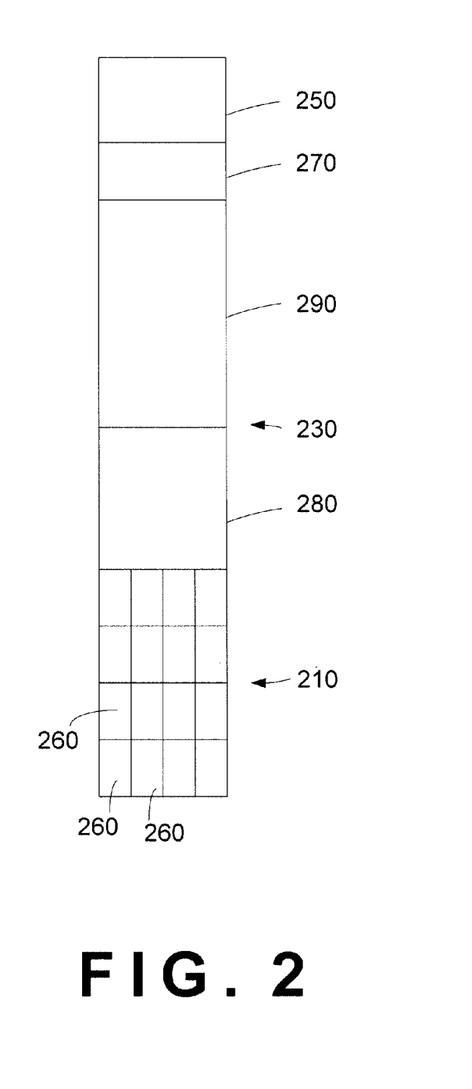
FIG. 2 is a block diagram of a configurable input/output (I/O) slot in accordance with aspects of the invention.

FIG. 2 is a block diagram of an example configurable input/output (I/O) slot according to an embodiment of the invention. The I/O slot includes an impedance matching and termination section 210, a conversion section 230, and, as shown in FIG. 2, a logic section 250. In some embodiments, each base template may be configured as power/ground pad.

The impedance matching and termination section includes subcells 260 formed of banks of transistors and resistors. Selected subcells are coupled by metallization to provide for operation over a range of impedances in conformance with a selected I/O standard. In most embodiments the selected subcells are coupled together variously in parallel and/or in series to provide the appropriate impedance range or termination characteristics.

Within the subcells selected ones of the transistors are turned on or off to provide an impedance or termination calibrated in accordance with the selected I/O standard. In one embodiment, each of the impedance or termination subcells includes a plurality of pull up structures coupled to a plurality of pull down structures.

The conversion section includes integrated circuit elements to convert signals from a core logic voltage domain to the I/O voltage domain. In some embodiments integrated circuit elements to convert currents between the core logic domain and the I/O domain are also provided. The conversion section includes sufficient numbers and types of integrated circuit components, primarily various transistors and resistors, that the components may be interconnected by metallization to provide conversion between the core logic domain and any one of a plurality of I/O domains as specified by various standards. In one embodiment, and as illustrated in FIG. 2, the conversion section includes a current and voltage subsection 270, a receiver subsection 280, and a pre-driver subsection 290.

The current and voltage subsection generally includes current and bias voltage translators. Preferably the current and bias voltage translators receive a bias voltage and a reference current, and generate bias voltages and reference currents for use in both the core domain and the I/O domain. Depending on a selected I/O standard, different configurations of translators may be coupled by metallization for use in the integrated circuit.

The receiver subsection is composed of a number of transistors forming a number of gates. The number of gates may be considered a sea of gates, with only selected ones of the gates of the sea of gates interconnected by metallization depending on a selected standard. The receiver subsection is generally configured to implement comparators, level translation and, in some embodiments, some logic operations in the core domain.

The pre-driver subsection is also composed of a number of transistors forming a number of gates. The number of gates also may be considered a sea of gates, with only selected ones of the gates of the sea of gates interconnected, depending on a selected standard. The pre-driver subsection is generally configured, by metallization, to provide level translation, slew-rate control and logical operations in the I/O domain.

The logic section is configured to receive and transmit signals and perform logic-based functions, based on selective interconnection by metallization of a plurality of gates. The logic section includes circuitry to receive signals from and transmit signals to circuitry located inside the I/O slot and circuitry located outside the I/O slot. The logic section also includes circuitry configurable by metallization to perform complex I/O functionality, user defined test functions, and high speed logic functions. In various embodiments, the logic section is configured to perform one or more of Joint Test Action Group (JTAG) testing, encoding, decoding, multiplexing, demultiplexing, clock resynchronization, or other functions.

Figure 3:
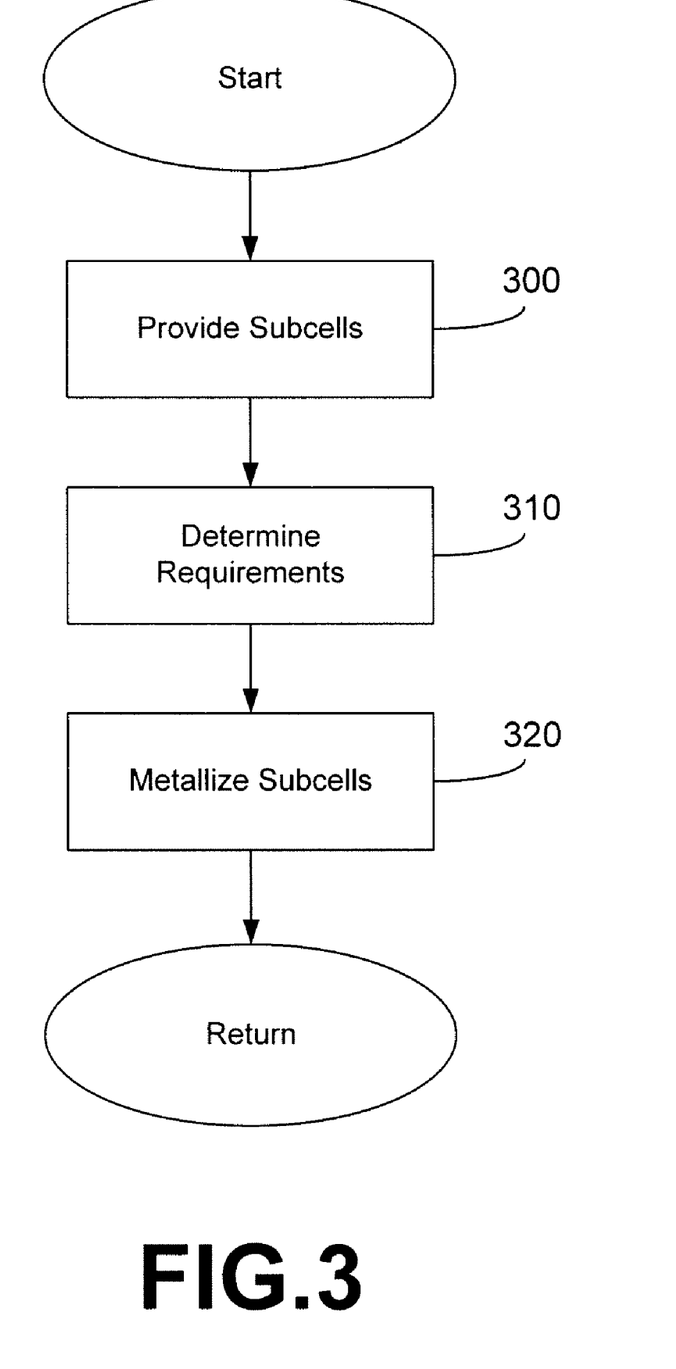
FIG. 3 is a flowchart of a method of configuring one or more I/O slots according to an embodiment of the invention.

FIG. 3 is a flowchart illustrating a method of configuring one or more I/O slots according to an embodiment of the invention. In many embodiments the I/O slots are as described with respect to FIG. 2, or with respect to the other figures. In block 300 the process configures an I/O slot by providing subcells in one or more I/O slots. The process determines one or more requirements for each of the I/O slots in block 310. In block 320 the process metallizes each of the I/O slots to couple together selected subcells and, in some embodiments, to couple together selected gates and/or, in some further embodiments, transistors of the sub-cells. The process may therefore configure I/O slots through metallization as desired, providing for flexibility in I/O assignment across an I/O ring of a die.

In one embodiment, each of the I/O slots is provided with a plurality of subcells that are the same across the I/O slot. In other embodiments, the I/O slots are provided with a plurality of subcells that differ across an I/O slot. In one embodiment, each of the subcells is configured with a plurality of circuit elements fabricated from semiconductor material. In one embodiment, each of the subcells of the I/O slot include the same circuit elements. In another embodiment, one or more of the subcells of the I/O slot include different circuit elements.

In another embodiment, each of the subcells includes a bank of components including short and long channel thin and thick oxide transistors and multiple resistor types and sizes to realize different configurations, for example to fulfill different I/O requirements, across different I/O slots.

In one embodiment, the one or more requirements for each of the I/O slots are determined based on desired I/O requirements for which the I/O slot is configured. In various embodiments, the requirements include impedance requirements, voltage requirements, current requirements, and programmable logic functions. The requirements may be determined based on the I/O interfacing needs. The I/O interfacing needs may be determined by the I/O slot designer.

In one embodiment, each I/O slot is metallized by providing a metal layer disposed on a layer containing the subcells of the I/O slot, with vias used as appropriate. The metal layer is disposed on the layer containing the subcells such that one or more selected subcells are connected, in various ways in various embodiments, to form a selected subcell configuration. In some embodiments the subcells are coupled in series and/or in parallel. In many cases the metallized configuration of subcells is indicative of the requirements determined to be required for the I/O slot. The requirements, in turn in many cases, are indicative of an I/O standard by which the I/O slot should interface. The requirements may include impedance, voltage and current requirements. Accordingly, the subcell configuration results in impedance, voltage and/or current performance according to the configuration of the I/O slot.

Further, the different I/O slots may be configured according to the same or different I/O requirements. Thus, for example, adjacent I/O slots may be configured according to operate to the same I/O requirements, or different I/O requirements.

In some embodiments, the I/O slot includes two or more layers of subcells with a metal layer disposed between each two layers of subcells. Vias in the metal layer are configured to couple one or more subcells in the first layer of subcells with one or more subcells in the second layer of subcells thereby creating a multi-dimensional subcell configuration. In another embodiment, the metal layer may also couple together subcells in the same layer to create a one dimensional subcell configuration. Thus, for example the metal layer for a first I/O slot may be configured differently from that of a metal layer of a second I/O slot to provide interfacing according to different requirements by the first I/O slot and the second I/O slot.

In one embodiment, each of the subcells for each of the I/O slots includes the same circuit elements. In another embodiment, one or more of the subcells for each of the I/O pads includes different circuit elements. In one embodiment, the circuit elements include transistors, resistors and the like. In one particular embodiment, the circuit elements form pull up transistor circuits and pull down transistor circuits, among other circuits.

One or more I/O slots may be configured to provide I/O interfacing according to different requirements. In one embodiment, a first I/O slot is configured to provide interfacing according to the Complementary Metal Oxide Semiconductor (CMOS) requirements; and a second I/O slot is configured to provide interfacing according to the Transistor-Transistor Logic (TTL). However, the subcell configurations for the I/O slots can be such that the I/O slots interface according to any other of a number of I/O requirements, for example requirements of some or all of HSTL, LVDS, CML, PECL, DAC, ADC, SSTL, USB, I2C, or other requirements.

Figure 4:
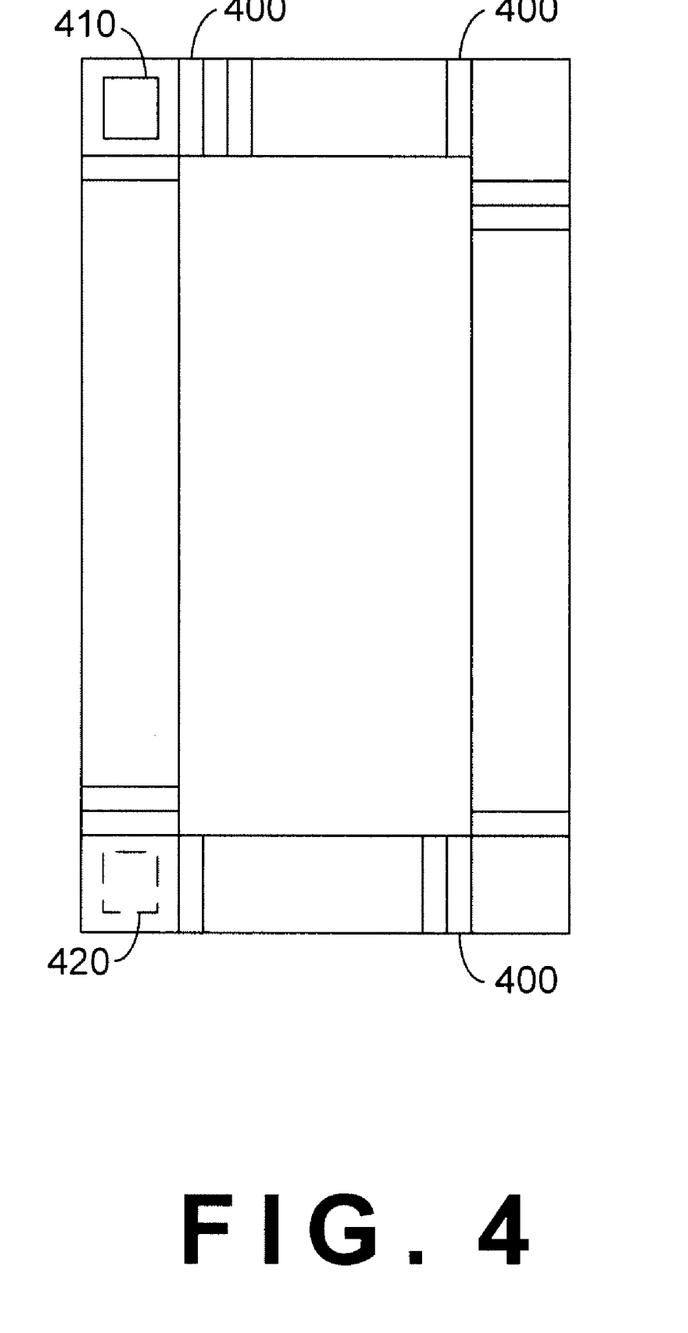
FIG. 4 is a block diagram of a die including one or more configurable I/O slots and a reference unit coupled to one or more of the I/O pads.

FIG. 4 is a block diagram of a die including one or more configurable I/O slots 400 and a reference unit 410 coupled to one or more of the I/O slots. In one embodiment, each of the I/O pads 400 is coupled to the reference unit. In most embodiments the reference unit comprises elements of a bandgap circuit, which may also be termed a bandgap voltage reference circuit. In one embodiment, the reference unit is also coupled to a repeater 420 that is coupled to one or more of the I/O slots.

The reference unit includes circuitry configured to provide a voltage reference signal. In some embodiments the reference unit is also configured to provide a current reference signal. The voltage reference signal is received by the I/O slots. Each of the I/O slots includes circuitry for using the voltage reference signal, and current reference signal if applicable, in generating voltage and current biases for use in the I/O slot, for example use by comparators and level shifters in the I/O slot. The circuitry for using the voltage reference signal in generating voltage and current biases differs depending on the metallization pattern selected for the I/O slot, with the selected metallization portion dependent on the I/O requirements which the I/O slot is to implement. This circuitry, which in some embodiments of I/O slots, such as described with respect to FIG. 2, is located in the current and voltage subsection of the conversion section, therefore is configured to generate possibly different voltage and current biases depending on the circuit elements coupled together by different metallization patterns. Accordingly, the reference unit generates reference voltage and currents to all of the I/O slot notwithstanding the I/O standard by which the I/O slot is configured.

In one embodiment, the reference unit is located on the die at a position determined by the die designer and each of the I/O slots is located about the periphery of the die. In most embodiments the reference unit is located approximate a corner of the die.

The repeater includes circuitry to regenerate the reference signal provided by the reference unit. In most embodiments the repeater cell may be embedded approximate a corner of the die, generally a different corner than a corner where the reference unit may be located.

In many embodiments a calibration unit is used in conjunction with the reference unit, and in some embodiments may be considered part of the reference unit or co-located with the reference unit. Preferably, a single calibration unit on the die is used to generate calibration signals for use by each I/O slot, notwithstanding the I/O slots may have different I/O standards. The calibration signals are used by the I/O slots to achieve, for example, a specific input/output impedance. Accordingly, a common base template and a single calibration unit can be used to provide I/O according to multiple I/O standards.

A uniform electrostatic discharge (ESD) structure is also provided across multiple I/O slots having different I/O standards. The uniform ESD structure is preferably an ESD structure rated for a maximum of any of the I/O standards, including any requirements of power or ground pads. Use of such an ESD structure simplifies design and construction of the die. Moreover, use of the uniform ESD structure allows for increased flexibility of assignment of I/O slots of various standards across the I/O ring, and for flexibility in assignment of ground and power slots. The flexibility in assignment of ground and power slots allows a ground or power pad to be assigned to any I/O slot in the I/O ring.

Figure 5:
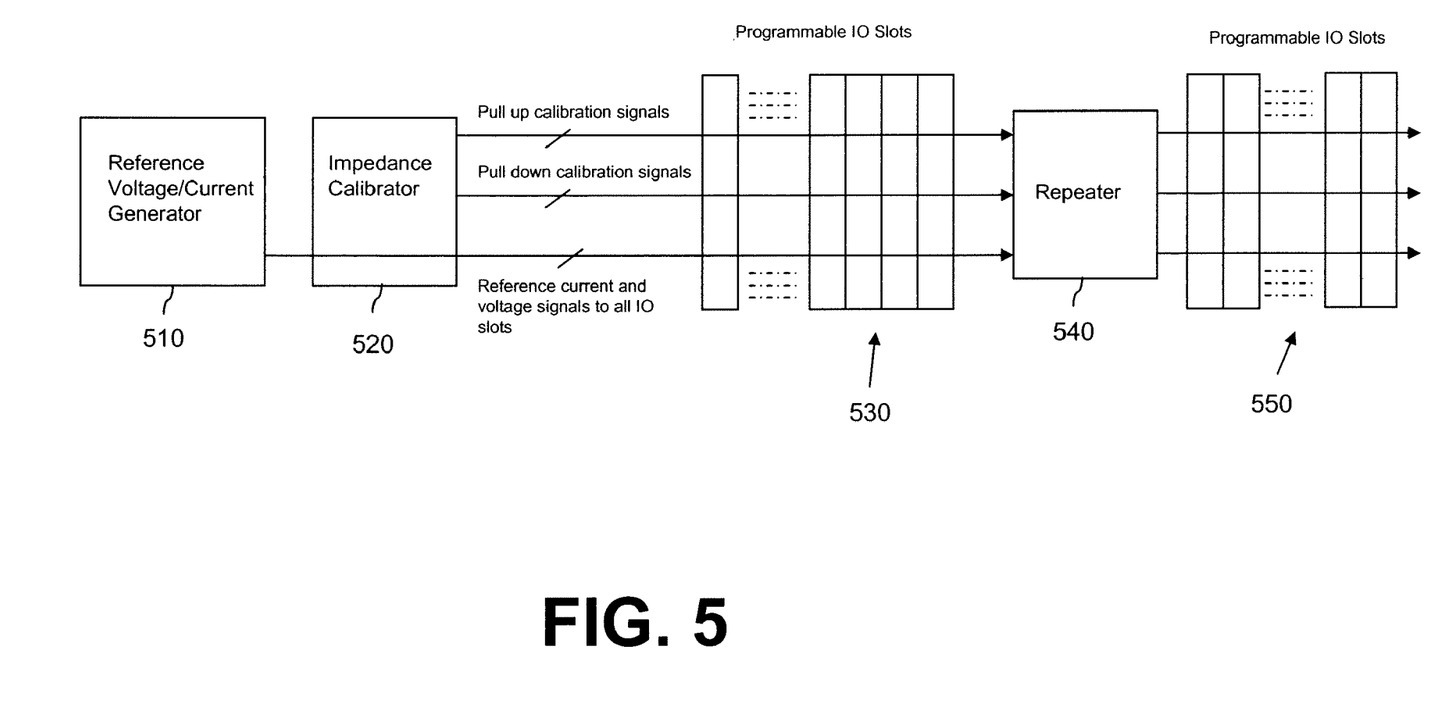
FIG. 5 is a block diagram of a reference unit including a reference voltage unit coupled to a calibration unit.

FIG. 5 is a block diagram of an embodiment of portions of a die in accordance with aspects of the invention. A reference voltage/current generator 510 provides a reference voltage signal and, optionally, a reference current signal. In many embodiments the reference voltage/current generator comprises a bandgap circuit, from which a reference voltage may be derived. The reference voltage signal, and optional reference current signal, is provided to an impedance calibration circuit 520. An example impedance calibration circuit is discussed with respect to FIG. 6. The impedance calibration circuit generates calibration signals, which are provided to I/O slots 530, along with the reference voltage signal and the reference current signal. In some embodiments, and as illustrated in FIG. 5, the calibration and reference signals are also provided to a repeater circuit 540, which provides the signals to further I/O slots 550.

In one embodiment, the reference voltage/current generator is circuitry configured to output a signal that is indicative of the bandgap of semiconductor material of the die. Thus, the reference voltage unit may be a bandgap circuit that generates an accurate voltage reference signal that includes information indicative of a reference voltage level. In some embodiments, the reference voltage unit is circuitry configured to output a signal that is fairly stable across process voltage temperature (PVT) variations of wafer lots including dies in accordance with aspects of the invention.

The reference voltage signal is distributed to each of the I/O pads. The voltage reference signal is converted locally within each I/O pad to meet the requirements of the I/O standard by which the I/O pad is configured to operate. In one embodiment, the calibration unit includes circuitry configured to output a calibration signal, usually in the form of multiple signals, indicative of an instruction to activate one or more circuit elements. Each of the circuit elements is included in a subcell of an I/O slot receiving the calibration signal. In many embodiments the signal is in the form of multiple signals providing a calibration code, the calibration code indicative of, for example, a number of pull up transistors which should be activated and a number of pull down transistors which should be activated. In one embodiment, the signal includes information indicative of which circuit elements in the subcell to power on/off. Generally, the calibration signal, or portions of the calibration signal, is provided to selected gates of the circuit elements.

Figure 6:
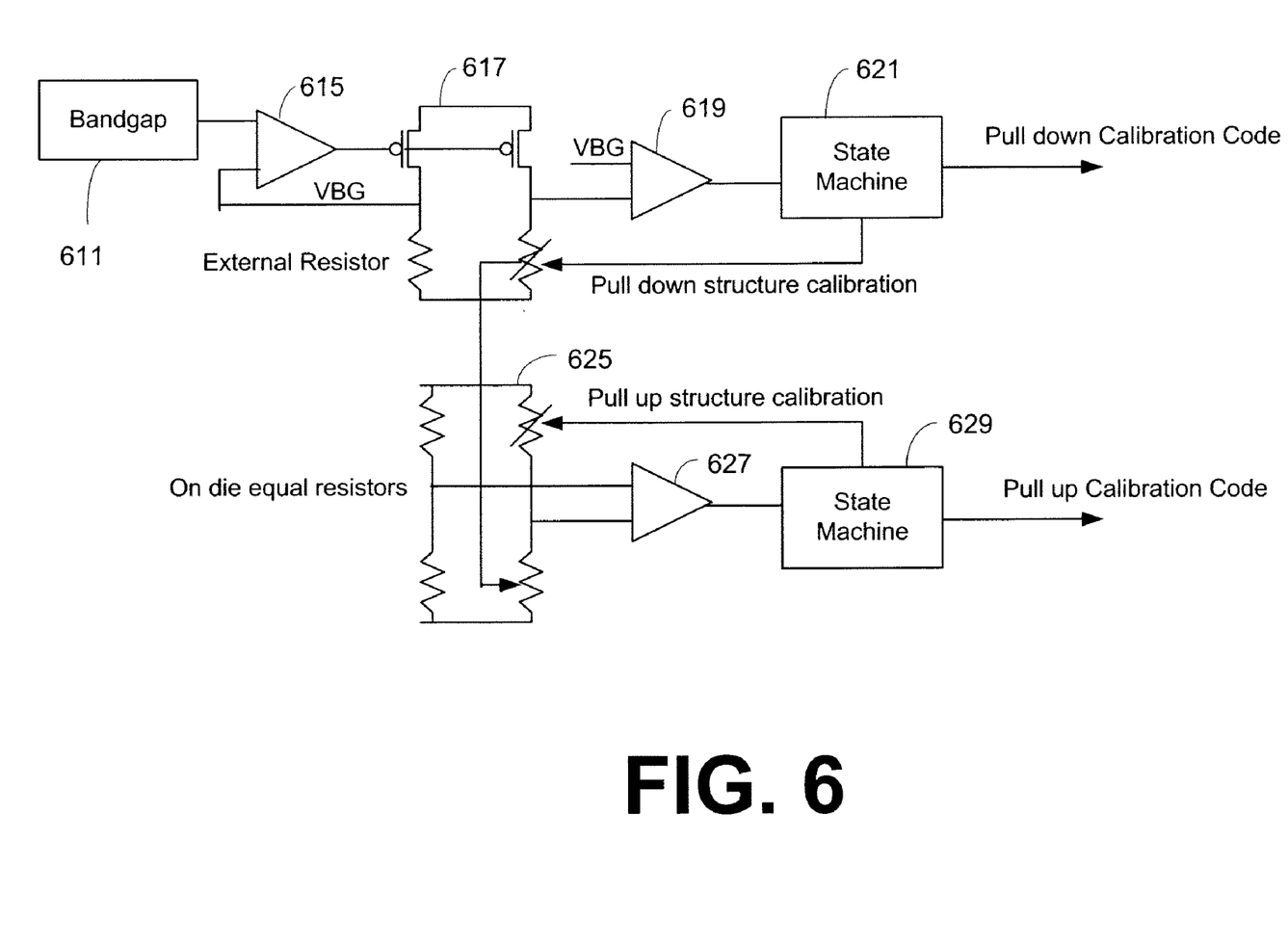
FIG. 6 is a circuit diagram of a calibration unit according to an embodiment of the invention.

FIG. 6 is a semi-schematic semi-block diagram of a calibration unit according to an embodiment of the invention. A bandgap circuit 611 provides a signal indicative of a bandgap of the die. The signal indicative of the bandgap of the die is received by a comparator 615. The comparator compares the signal with a voltage bandgap (VBG) signal fed back from a pull down structure 617. The pull down structure includes a pair of legs each with a transistor and a resistor, in series. The first leg includes an external resistor, whose resistance may be accurately specified. The second leg includes a variable resistance. The variable resistance may be formed in a number of ways. In some embodiments the variable resistance includes resistances in parallel, with different resistances receiving a current based on a control signal. The VBG signal is taken from the midpoint of the first leg. An output of the pull down structure is taken from a midpoint of the second leg.

The output of the pull down structure leg is received by a further comparator 619. The further comparator also receives as an input the VBG signal. The output of the further comparator is received by a state machine 621. The state machine is configured to generate the control signal which is provided to the variable resistance of the second leg, and the control signal may be termed a pull down structure calibration signal. As the comparator 615 effectively drives the VBG signal to be equal to the bandgap signal, and the further comparator 619 provides a signal indicative of the difference between VBG and the midpoint of the second leg, the state machine 621 is able to determine a pull down structure calibration signal so as to adjust he variable resistance to account for process and temperature variations. The state machine 621 is also configured to generate a pull down calibration code, for distribution to the various I/O slots, with the pull down calibration code generally matching the pull down structure calibration code.

The circuit of FIG. 6 also includes a pull down structure 625. The pull down structure 625 includes two legs, with on-die equal resistors forming a first leg and variable resistances forming the second leg. The resistance of a lower variable resistance is determined by the pull down structure calibration code. A comparator 627 receives signals from the midpoint of each of the two legs, and provides an output to a state machine 629. The state machine 629 is configured to generate both a pull up structure calibration code provided to an upper variable resistance of the second leg and a pull up calibration code, generally matching the pull up structure calibration code, for distribution to the I/O slots. Accordingly the pull down structure may be calibrated, with the calibrated pull down structure used to calibrate the pull up structure. In most embodiments calibration is performed automatically as part of a power up process. In some embodiments calibration may be performed upon command, either from an external source or from higher level logic on the die. Further, in some embodiments the pull up and pull down structures may be powered down after performing calibration.

Thus, in one embodiment, the calibration circuitry is configured to compare information indicative of the signal output from the reference voltage unit to a signal indicative of process voltage temperature variation across the die. The calibration circuitry infers a calibration code on the result of the comparison. The calibration circuitry computes a calibration code using the plurality of state machines. The calibration circuitry outputs the calibration signal to each of the I/O subcells. The calibration signal includes information indicative of the calibration code.

Figures 7, 7C:
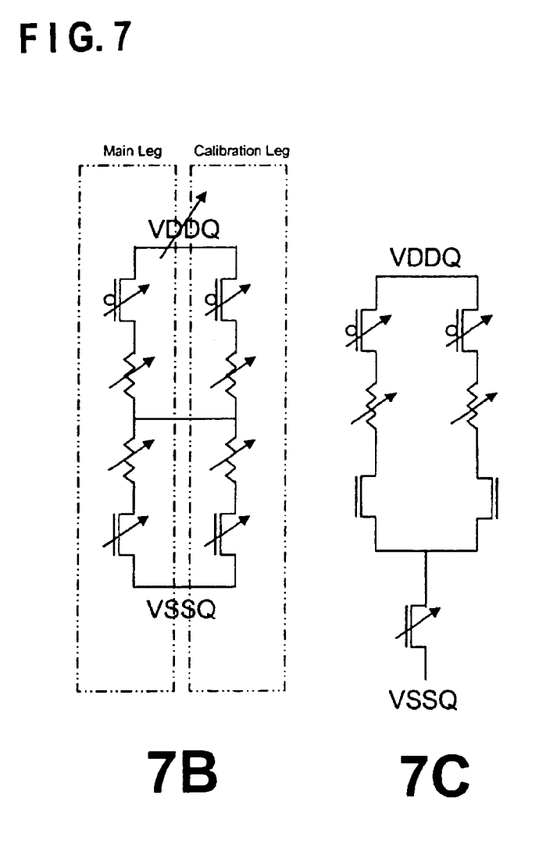
Figures 7, 7E:
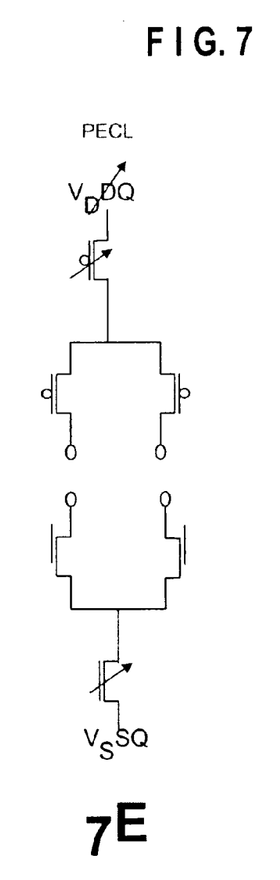
Figure 7:
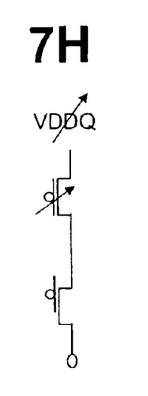
Figure 7A:
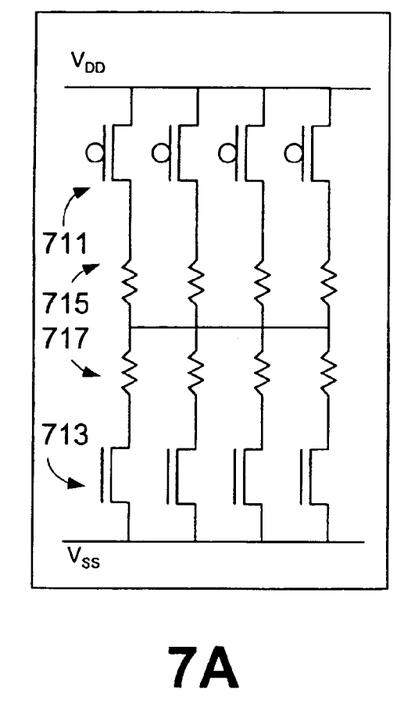

FIGS. 7A-N are sample circuit schematics illuminating aspects of subcells of I/O slots. Generally, each I/O slot receives a signal output from the calibration and adjusts its I/O impedance characteristics in accordance with the content of the signal from the calibration unit. FIG. 7A is a schematic providing a conceptual understanding of some embodiments of subcells providing for impedance calibration. In FIG. 7A a plurality of pull up transistors 711 are coupled in parallel to VDD, and a plurality of pull down transistors are coupled to VSSQ. Pull up resistors 715 couple the pull up transistors to a common node, and pull down resistors 717 couple the pull down transistors to the common node. Different ones of the pull up transistors and the pull down transistors are activated depending on a pull up calibration code and a pull down calibration code, respectively.

Figure 7D:
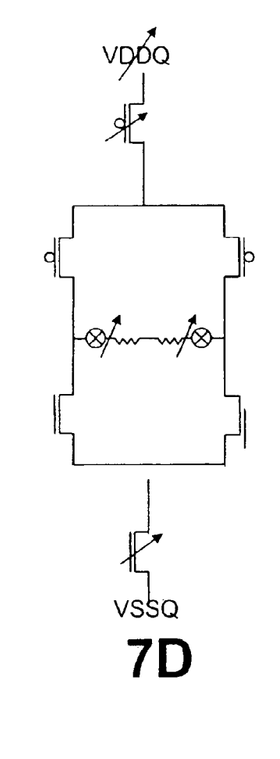
Figure 7F:
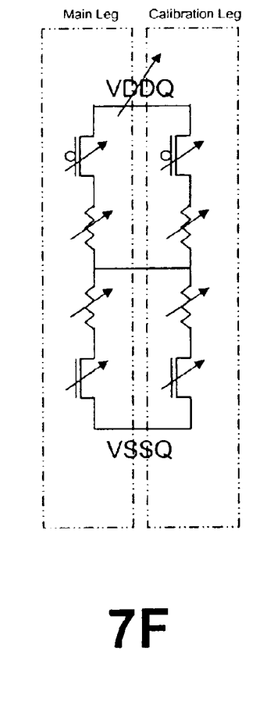
Figure 7G:
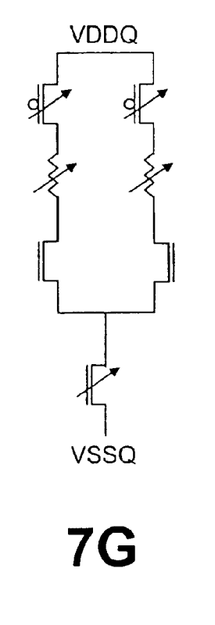

FIGS. 7B and 7C conceptually illustrate circuitry for complementary I/O signaling sub-cells. FIG. 7D conceptually illustrates circuitry for LVDS output subcells. FIG. 7E conceptually illustrates circuitry for CML and PECL output subcells. FIG. 7F conceptually illustrates circuitry for LVCMOS, TTL, SSTL, HSTL, and other output subcells. FIG. 7G conceptually illustrates circuitry for ECL output subcells. FIG. 7H conceptually illustrates circuitry for an open drain output subcell. FIG. 7I conceptually illustrates circuitry for an open source output subcell. FIG. 7J conceptually illustrates circuitry for a differential termination subcell. FIG. 7K conceptually illustrates circuitry for a differential termination. FIG. 7L conceptually illustrates circuitry for a single ended parallel termination subcell. FIG. 7M conceptually illustrates circuitry for a single ended pull up termination subcell. FIG. 7N conceptually illustrates circuitry for a single ended pull down termination.

Figure 8:
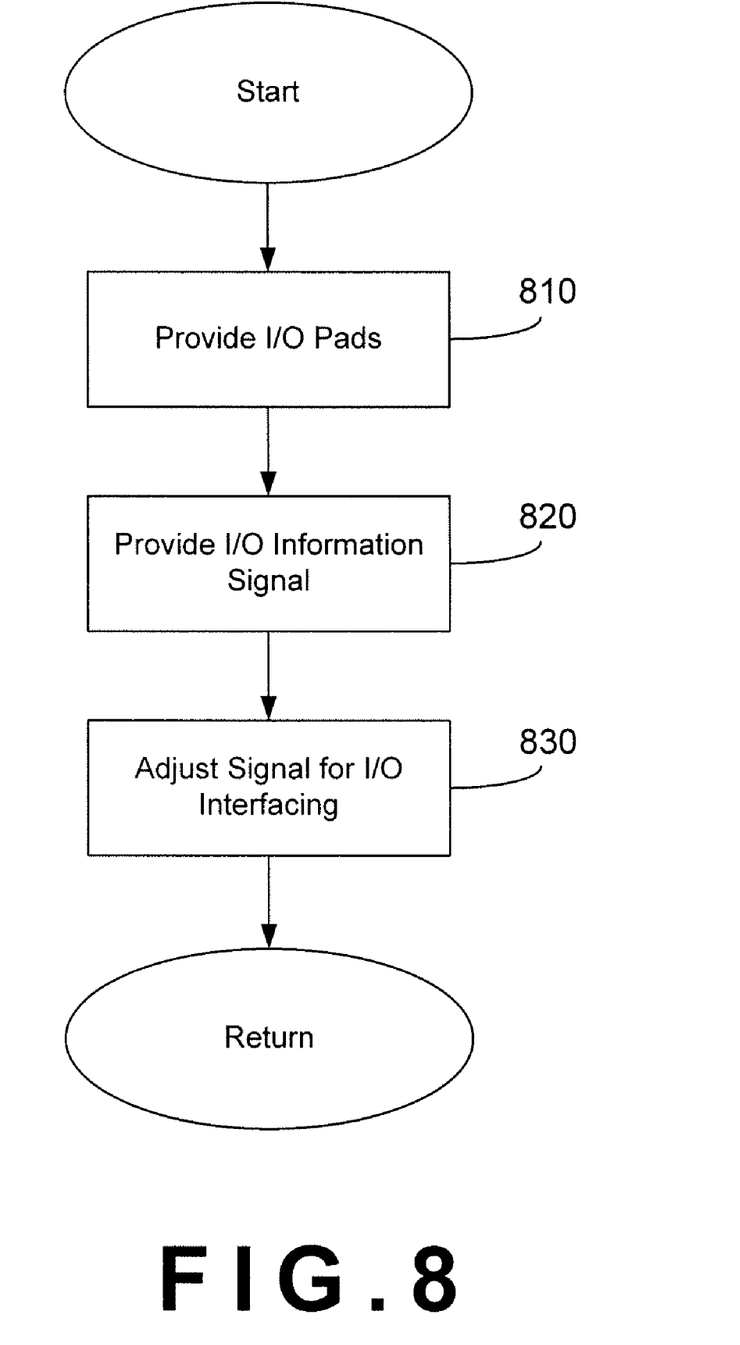
FIG. 8 is a flowchart illustrating a method of controlling a configurable I/O slot on a die.

FIG. 8 is a flowchart illustrating a process of adjusting impedance characteristics of a configurable I/O slot on a die. In one embodiment of the process, in block 810 the process provides a plurality of I/O slots. Each of a plurality of I/O slots includes circuitry configured to provide I/O interfacing according to an I/O interface requirement. The I/O interface requirement for each of the slots may be the same as or different from the I/O requirements for other slots. In block 820 an I/O reference signal and a calibration signal is provided to each of the plurality of the I/O slots. In block 830 the I/O slots adjust I/O impedance characteristics.

Accordingly, the invention provides I/O methods and circuitry for integrated circuits. Although the invention has been described with respect to certain embodiments, it should be recognized that the invention comprises the claims and their insubstantial variations supported by this disclosure.

What is claimed is:

1. A configurable input/output (I/O) block comprising:
a plurality of subcells; and
a metal layer configured to couple selected ones of the subcells of the plurality of subcells in a configuration to provide I/O interfacing pursuant to a selected I/O requirement, where the I/O block is configurable to operate pursuant to a plurality of I/O requirements and the configuration of the metal layer corresponds to the selected I/O requirement.

2. The configurable input/output (I/O) block of claim 1, further comprising:
a logic section configured to perform logic functions and communicate with one or more of the subcells; and
circuitry configured to convert signals adapted to be transmitted between the logic section and one or more of the subcells for communication between the logic section and one or more of the subcells.

3. A method of configuring input/output (I/O) blocks, the method comprising:
providing one or more I/O blocks, each of the one or more I/O blocks having a plurality of subcells, and each of the one or more I/O blocks configurable to operate pursuant to requirements selected from a plurality of requirements;
determining one or more requirements for each of the one or more I/O blocks; and
metallizing each of the I/O blocks based on the determined one or more requirements to couple only selected ones of the subcells of the plurality of subcells in a configuration indicative of the one or more requirements.

4. A die having integrated circuitry, the die comprising:
one or more configurable input/output (I/O) blocks, each of the I/O blocks comprising:
a plurality of subcells; and
a metal layer configured to couple only selected ones of the subcells of the plurality of subcells in a configuration to provide I/O interfacing indicative of an I/O requirement, where the I/O block is configurable to operate pursuant to a plurality of I/O requirements and the configuration of the metal layer corresponds to the selected I/O requirement.

5. The die of claim 4, further comprising a reference block configured to output to each of the I/O blocks a signal for adjusting the I/O interfacing.

6. The die of claim 5, wherein the signal includes a reference voltage level and a signal indicative of a desired power status of one or more circuit elements in the plurality of the subcells; and wherein he reference block includes a calibration block configured to output to the plurality of the I/O blocks the signal indicative of the desired power status of one or more circuit elements in the plurality of subcells.

7. The die of claim 6 wherein the reference block is further configured to output a signal indicative of a reference current level to each of the I/O blocks.

8. A plurality of dies each having integrated circuitry, the integrated circuitry including an input/output (I/O) ring forming a plurality of I/O slots, each of the dies having a common base template of circuit elements in the I/O ring, at least some of the circuit elements arranged in subcells, with metallization connecting only some of the subcells based on a selected I/O standard for each I/O slot.

9. The plurality of dies of claim 8, with each die further including a single reference unit operatively providing a reference voltage to each of the I/O slots.

10. The plurality of dies of claim 9, with each die including means for providing a calibration signal to each of the I/O slots for use by the I/O slots in achieving a desired impedance characteristic.

11. The plurality of dies of claim 8 wherein each of the I/O slots includes a uniform electrostatic discharge (ESD) structure.

* * * * *